United States Patent
Kim

(10) Patent No.: US 10,332,602 B2
(45) Date of Patent: Jun. 25, 2019

(54) NONVOLATILE MEMORY DEVICE FOR VARYING A RECOVERY SECTION AND OPERATING METHOD THEREOF

(71) Applicant: Samsung Electronics Co., Ltd., Suwon-si (KR)

(72) Inventor: Doo-hyun Kim, Ansan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 16 days.

(21) Appl. No.: 15/839,121

(22) Filed: Dec. 12, 2017

(65) Prior Publication Data

US 2018/0211709 A1   Jul. 26, 2018

(30) Foreign Application Priority Data

Jan. 20, 2017 (KR) .......................... 10-2017-0009931

(51) Int. Cl.
| | |
|---|---|
| *G11C 16/04* | (2006.01) |
| *G11C 16/14* | (2006.01) |
| *G11C 16/24* | (2006.01) |
| *G11C 16/34* | (2006.01) |
| *G11C 16/08* | (2006.01) |
| *G11C 16/10* | (2006.01) |
| *G11C 16/32* | (2006.01) |

(52) U.S. Cl.
CPC .......... *G11C 16/14* (2013.01); *G11C 16/0483* (2013.01); *G11C 16/08* (2013.01); *G11C 16/10* (2013.01); *G11C 16/24* (2013.01); *G11C 16/32* (2013.01); *G11C 16/3459* (2013.01)

(58) Field of Classification Search
CPC ..... G11C 16/14; G11C 16/0483; G11C 16/08; G11C 16/10; G11C 16/24
USPC ....................................... 365/185.18, 185.25
See application file for complete search history.

(56) References Cited

U.S. PATENT DOCUMENTS

| | | | |
|---|---|---|---|
| 7,151,695 B2 | 12/2006 | Choy et al. | |
| 7,663,925 B2 | 2/2010 | Yu et al. | |
| 7,804,712 B2* | 9/2010 | Kim | G11C 16/3427 |
| | | | 365/185.03 |
| 7,813,183 B2 | 10/2010 | Moon et al. | |
| 8,149,635 B2 | 4/2012 | Lee | |
| 8,228,734 B2 | 7/2012 | Wang | |
| 8,625,367 B2 | 1/2014 | Yun et al. | |
| 8,730,735 B2 | 5/2014 | Park | |
| 9,230,659 B2 | 1/2016 | Choi et al. | |
| 2005/0248991 A1 | 11/2005 | Lee et al. | |
| 2007/0136563 A1* | 6/2007 | Park | G11C 16/34 |
| | | | 712/220 |

(Continued)

*Primary Examiner* — Vu A Le
(74) *Attorney, Agent, or Firm* — Muir Patent Law, PLLC

(57) ABSTRACT

Provided is a method of operating a nonvolatile memory device including a memory cell array connected to a plurality of lines. The method may include performing a first loop including a first recovery section having a first operation time period, on a first line of the plurality of lines by applying a first voltage for a time period, wherein the first voltage is discharged with a first slope, and performing a second loop after the first loop including a second recovery section having a second operation time period that is different from the first operation time period, on the first line by applying a second voltage for a time period, wherein the second voltage is discharged with a second slope less than the first slope.

20 Claims, 15 Drawing Sheets

(56) References Cited

U.S. PATENT DOCUMENTS

2016/0012903 A1    1/2016   Desai et al.
2016/0260489 A1    9/2016   Lee et al.

\* cited by examiner

NONVOLATILE MEMORY DEVICE FOR VARYING A RECOVERY SECTION AND OPERATING METHOD THEREOF

CROSS-REFERENCE TO RELATED APPLICATION

This application claims the benefit of Korean Patent Application No. 10-2017-0009931, filed on Jan. 20, 2017, in the Korean Intellectual Property Office, the disclosure of which is incorporated herein in its entirety by reference.

BACKGROUND

The present disclosure relates to a nonvolatile memory device, and more particularly, to a nonvolatile memory device for varying a recovery section and an operation method thereof.

Nonvolatile memory devices, such as flash memory systems are widely used in electronic devices such as a universal serial bus (USB) drive, a digital camera, a mobile phone, a smart phone, a tablet personal computer (PC), a memory card and a solid state drive (SSD). It is important for a memory system including a nonvolatile memory device to extend its capacity and improve the speed of a memory operation such a write and erase operation.

In a memory operation of a memory system, in general, a setup operation on various lines may be performed before performing an operation such as a write, an erase and a read operation. Also, a recovery operation may be performed as an initial operation for various lines after performing an operation such as a write, a read and an erase operation. However, the setup operation or the recovery operation increase not only a total time required for a whole memory operation but also power consumption.

SUMMARY

The present disclosure provides a nonvolatile memory device that reduces a time of performing a memory operation and power consumption and an operation method thereof According to an aspect of the inventive concept, there is provided a method of operating a nonvolatile memory device, which the nonvolatile memory device performs a memory operation including a plurality of loops with respect to the memory cell array, including a memory cell array connected to a plurality of lines. The method includes performing a first loop of the plurality of loops including a first recovery section having a first operation time period, on a first line of the plurality of lines by applying a first voltage for a time period, wherein the first voltage is discharged with a first slope; and performing a second loop of the plurality of loops after the first loop including a second recovery section having a second operation time period that is different from the first operation time period, on the first line by applying a second voltage for a time period, wherein the second voltage is discharged with a second slope less than the first slope. The first line may include at least one of a word line, a bit line, a string selection line, a ground selection line and a common source line.

According to another aspect of the inventive concept, there is provided a method of operating a nonvolatile memory device including a memory cell array having a plurality of memory cells connected to a plurality of lines, which the nonvolatile memory device performs a memory operation including a plurality of loops with respect to the memory cell array. The method includes associating a count value with each loop of the plurality of loops; setting, based on the count value of a fist loop, a first operation time period for a first recovery section of the first loop; and performing the first loop including the first recovery section where the first operation time period is set on a first line of the plurality of lines. The first line may include at least one of a word line, a bit line, a string selection line, a ground selection line and a common source line.

According to still another aspect of the inventive concept, there is provided a method of operating a nonvolatile memory device including a memory cell array connected to a plurality of lines. The method includes performing a plurality of loops, and for each loop, applying a voltage to a first line of the plurality of lines for a time period and discharging the voltage applied to the first line to a first level during a recovery time period. The recovery time period is adjusted based on a count value of a loop of the plurality of loops. Each loop of the plurality of loops is either a program loop in a program operation of the nonvolatile memory device or an erase loop in an erase operation of the nonvolatile memory device. The first line may include at least one of a word line, a bit line, a string selection line, a ground selection line and a common source line.

BRIEF DESCRIPTION OF THE DRAWINGS

Various example embodiments will be more clearly understood from the following detailed description taken in conjunction with the accompanying drawings in which.

DETAILED DESCRIPTION

Figure 1:
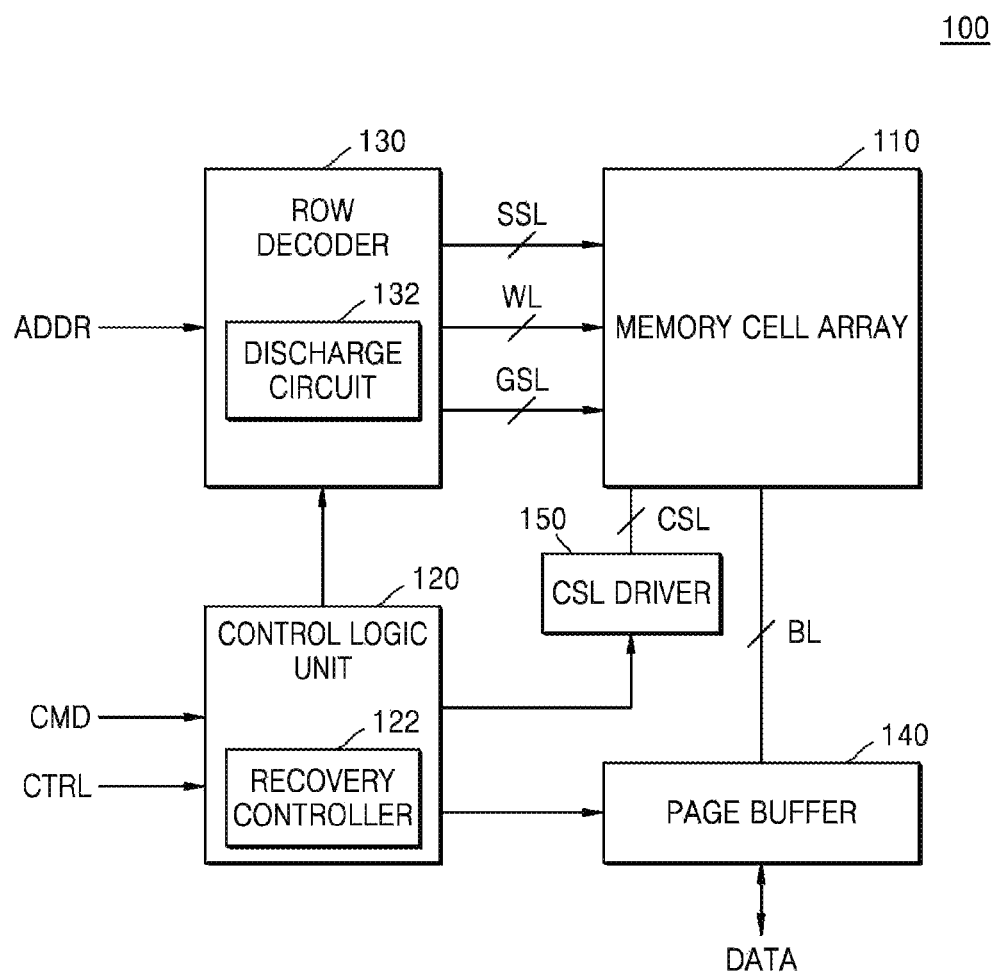
FIG. 1 illustrates a block diagram of a memory device according to an exemplary embodiment of the inventive concept.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

The embodiments are described, and illustrated in the drawings, in terms of functional blocks, units and/or modules. These blocks, units and/or modules may be physically implemented by electronic (or optical)) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated circuit.

FIG. 1 illustrates a block diagram of a memory device according to an exemplary embodiment of the inventive concept.

Referring to FIG. 1, a memory device 100 may include a memory cell array 110, a control logic unit 120, a row decoder 130, a page buffer 140, and a common source line driver 150. Although not described herein, the memory device 100 may further include a data input/output (I/O) circuit or an I/O interface.

The memory cell array 110 may include a plurality of memory cells connected to string selection lines SSL, word lines WL, ground selection lines GSL, common source lines CSL and bit lines BL. In detail, the memory cell array 110 may be connected to the row decoder 130 via the string selection lines SSL, the word lines WL, and the ground selection lines GSL, and be connected to the page buffer 140 via the bit lines BL. The memory cell array 110 may also be connected to the common source line driver 150 via the common source lines CSL.

The memory cells included in the memory cell array 110 may be, for example, flash memory cells. Hereinafter, a plurality of memory cells will be described as NAND flash cells in exemplary embodiments of the inventive concept. However, embodiments are not limited thereto, and in another exemplary embodiment, the memory cells may include resistive memory cells such as a resistive RAM (RRAM), a phase change RAM (PRAM), or a magnetic RAM (MRAM).

The memory cell array 110 may include a plurality of blocks, and each of the blocks may have a planar structure or a three-dimensional structure. The memory cell array 110 may include at least one of a single level cell block including single level cells, a multi level cell block including multi level cells and a triple level cell block including triple level cells. For example, some of the blocks included in the memory cell array 110 may be single level cell blocks, and the other blocks may be multi level cell blocks or triple level cell blocks.

The control logic unit 120 controls an overall operation of the memory device 100 and, for example, may control the memory device 100 to perform a memory operation corresponding to a command CMD provided from a memory controller (not shown). For example, the control logic unit 120 may generate various internal control signals used in the memory device 100 in response to a control signal CTRL provided from the memory controller (not shown). In an exemplary embodiment, the control logic unit 120 may adjust a voltage level provided to word lines and bit lines during a memory operation such as a program, a read or an ease operation.

Each of a program or an erase operation among memory operations may include a plurality of loops. For example, a program operation may be performed by an incremental step pulse program (ISPP) method, and an erase operation may be performed by an incremental step pulse erase (ISPE) method. Each of the loops included in the program operation or erase operation may include a plurality of sections. For example, when a program (or erase) operation is requested from a memory controller (not shown), the control logic unit 120 may control various functional blocks in the memory device 100 so as to perform a memory operation including a setup section, a program (or erase) section and a recovery section. As described further below, a loop in the program operation may be referred as a program loop and a loop in the erase operation may be referred as an erase loop.

The control logic unit 120 may include a recovery controller 122. The recovery controller 122 may control, for example, a recovery operation for each line among memory operations performed on a word line WL, a bit line BL, a string selection line SSL, a ground selection line GSL and/or a common source line CSL. The recovery operation may include, for example, initializing a bias voltage applied to each line. For example, the initialized bias voltage may be a ground voltage, 0V.

In an exemplary embodiment, when a memory operation such as a program operation or an erase operation is performed, the recovery controller 122 may control an operation time (i.e., an operation time period) of a recovery section for each line. Also, the recovery controller 122 may control a waveform of a voltage level of a line or each of various control signals to perform a recovery operation, and control a changing slope of a line or each of the various control signals. The changing slope may mean, for example, a degree of a rise or a fall of a voltage level with respect to an operation time of a recovery section.

In an exemplary embodiment, in a first loop among loops included in a program (or erase) operation, the recovery controller 122 may control that a recovery section for one or more lines connected to a memory cell array may have a first operation time. Also, in a second loop among the loops included in the program (or erase) operation, the recovery controller 122 may control a recovery section for the one or more lines to have a second operation time that is different from the first operation time. The recovery controller 122 may control the second operation time to be longer than the first operation time, for example when the second loop is performed after the first loop. The one or more lines connected to the memory cell array may be, for example, at least one of a word line, a string selection line, a ground selection line and common source lines.

In an exemplary embodiment, in a first loop among loops included in a program (or erase) operation, the recovery controller 122 may control that a recovery section for one or more lines connected to a memory cell array may have a third operation time. In a second loop among the loops included in the program (or erase) operation, the recovery controller 122 may control the recovery interval for the one or more lines to have a fourth operating time that is different from the third operating time. In an exemplary embodiment, a loop count of the first loop and a loop count of the second loop may be respectively included in a first and a second range. A loop count may be, for example, a count value of loops currently being performed in a memory cell array by an ISPP or ISPE method, among a plurality of the loops included in the memory operation. The one or more lines connected to the memory cell array may be, for example, at least one of a bit line, a string selection line, a ground selection line and common source lines.

The row decoder 130 may select at least one of memory blocks of the memory cell array 110 in response to an address ADDR provided from a memory controller (not shown). The row decoder 130 may select at least one of word lines of a memory block selected in response to the address ADDR. The row decoder 130 may transfer a voltage for performing a memory operation to a selected word line of the memory block. For example, when a program operation is performed, the row decoder 130 may transfer a program voltage and a verify voltage to the selected word line and transfer a pass voltage to an unselected word line. Also, the row decoder 130 may select some string selection lines among string selection lines SSL in response to the address ADDR.

The row decoder 130 may include a discharge circuit 132 for performing a recovery operation on at least one of word lines WL, based on control by the recovery controller 122. The discharge circuit 132 may also perform a recovery operation on at least one of string selection lines SSL and ground selection lines GSL, based on control by the recovery controller 122. In example embodiments, the row decoder 130 may perform a recovery operation on at least one of word lines WL based on control by the recovery controller 122. The row decoder 130 may also perform a recovery operation on at least one of string selection lines SSL and ground selection lines GSL, based on control by the recovery controller 122.

In an exemplary embodiment, an amount of current applied to the discharge circuit 132 may be adjusted based on control by the recovery controller 122. Thus, the amount of current applied to the discharge circuit 132 may be controlled on a loop-by-loop basis, an operation time for a recovery section of each loop may be controlled.

The page buffer 140 may be connected to the memory cell array 110 via bit lines BL. The page buffer 140 may operate as a write driver or a sense amplifier. In detail, in a program operation, the page buffer 140 may operate as a write driver and apply to the bit lines BL a voltage according to data DATA to be stored in the memory cell array 110. In a read operation, the page buffer 140 may operate a sense amplifier and sense the data DATA stored in the memory cell array 110. The page buffer 140 may perform a recovery operation on at least one of bit lines BL based on control by the recovery controller 122.

The common source line driver 150 may be connected to the memory cell array 110 via common source lines CSL. The common source line driver 150 may apply a common source voltage to the common source lines CSL based on control by the control logic unit 120. The common source line driver 150 may perform a recovery operation on at least one of the common source lines CSL based on control by the recovery controller 122.

According to an exemplary embodiment of the inventive concept, a nonvolatile memory device and an operating method thereof may control a recovery operation for each loop of a memory operation such as a program or erase operation, thereby reducing a time needed for memory operations. In addition, a recovery operation is effectively performed for each loop of a memory operation such as a program or erase operation to reduce power consumption.

Figure 2:
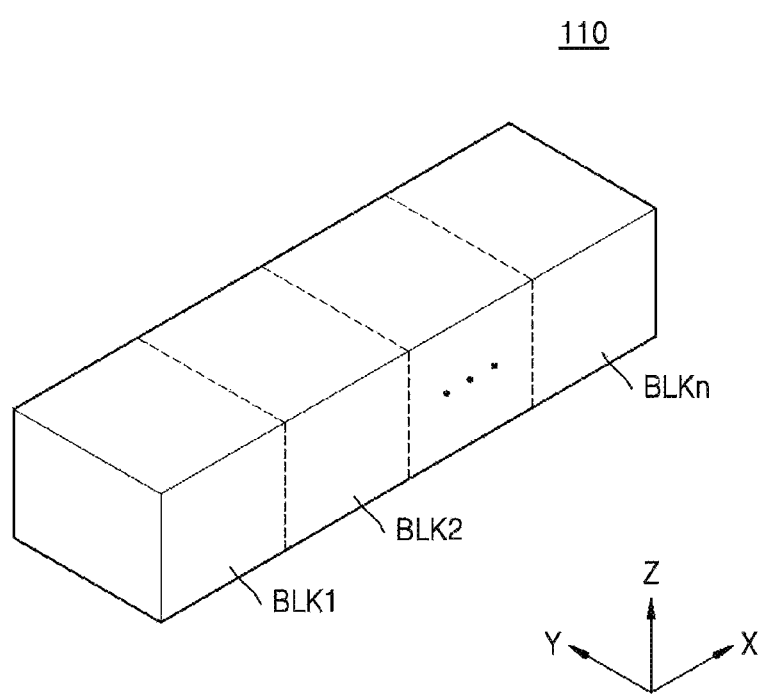
FIG.2 illustrates a block diagram showing an exemplary embodiment of the memory cell array of FIG. 1.

FIG. 2 illustrates a block diagram showing an exemplary embodiment of the memory cell array of FIG. 1.

Referring to FIG. 2, the memory cell array 110 may include a plurality of memory blocks BLK1 to BLKn. Each of the memory blocks BLK1 to BLKn may have a three-dimensional structure. (or vertical structure) In an exemplary embodiment, each of the memory blocks BLK1 to BLKn may include structures extending in a plurality of directions (x, y, z) corresponding to three dimensions. For example, each of the memory blocks BLK1 to BLKn may include a plurality of NAND cell strings extended in the z direction. In other words, each of the memory blocks BLK1 to BLKn may include NAND cell strings arranged in a vertical direction so that one memory cell is located above another memory cell. At least one memory cell included in a NAND cell string may include a charge trap layer.

Further referring to FIG. 1, the memory blocks BLK1 to BLKn may be selected by the row decoder 130. For example, the row decoder 130 may select a block corresponding to a block address, among the memory blocks BLK1 to BLKn. A memory operation, such as program, read or erase, may be performed in a memory block.

Figure 3:
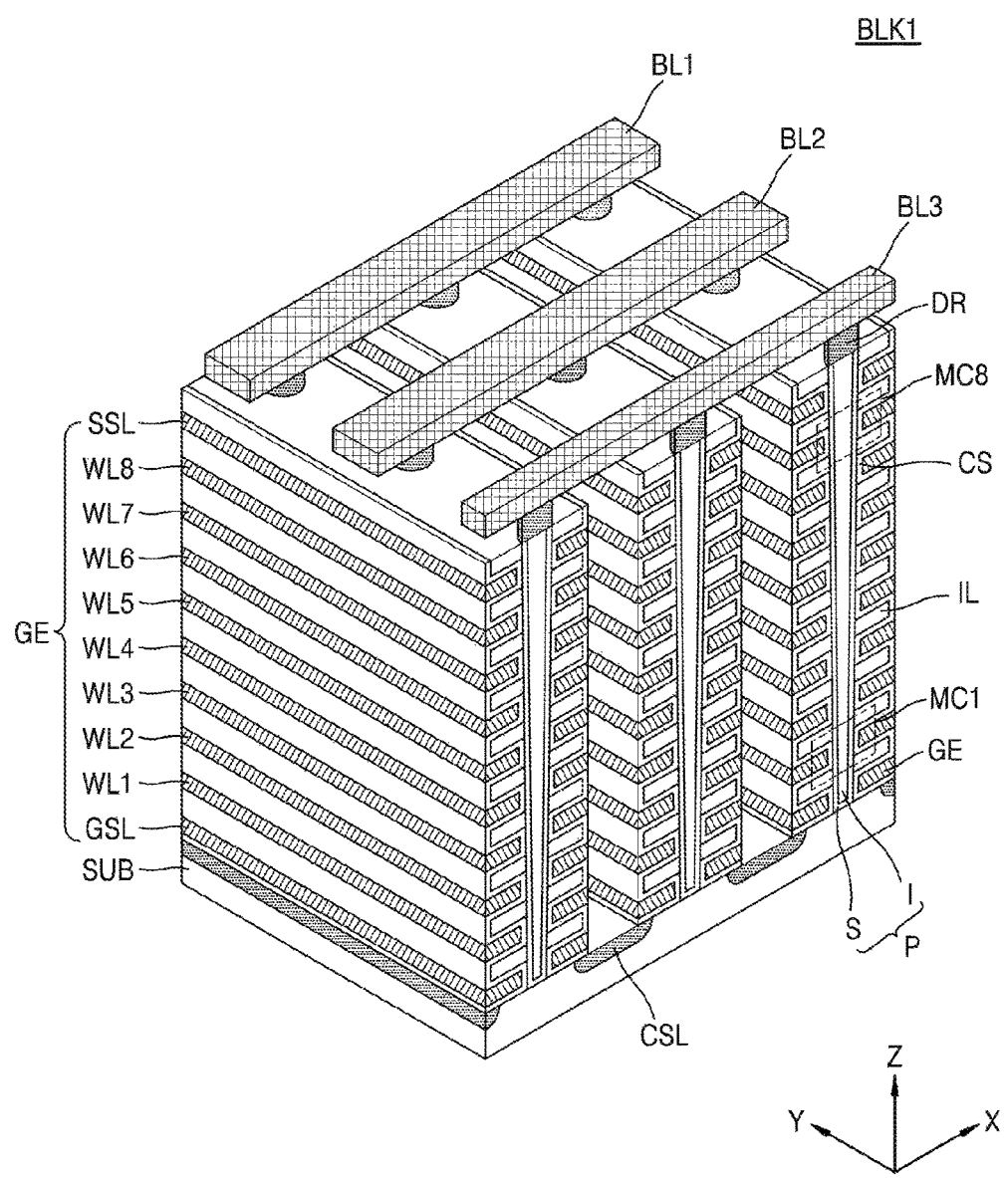
FIG.3 illustrates a perspective view showing an exemplary embodiment of a first block among the memory blocks of FIG. 2.

FIG. 3 illustrates a perspective view showing an exemplary embodiment of a first block among the memory blocks of FIG. 2.

Referring to FIG. 3, a first block BLK1 may be formed in a vertical direction with respect to a substrate SUB. In FIG. 3, the first block BLK1 is described to include the ground selection lines and string selection lines GSL and SSL, eight word lines WL1 to WL8, and three bit lines BL1 to BL3, but embodiments are not limited thereto. The first block BLK1 may have more or less lines than described in FIG. 3. Each NAND cell string may include a plurality of cell transistors connected to a plurality of lines, for example, a ground selection line GSL, a string selection line SSL, word lines WL1 to WL8, one of bit lines BL1 to BL3, and a common source line CSL.

The substrate SUB may have a first conductive type (e.g., p-type), extend on the substrate SUB in a first direction (e.g., Y direction), and include common source lines CSL doped with impurities of a second conductive type (e.g., n-type). A plurality of insulating films IL extending in the first direction are sequentially provided in the third direction (e.g., the Z direction) on the region of the substrate SUB between the two adjacent common source lines CSL. And the plurality of insulating films IL may be spaced apart by a certain distance in the third direction. For example, the insulating films IL may include an insulating material such as silicon oxide.

A plurality of pillars P may be provided to be sequentially aligned in the first direction and pass through the insulating films IL in the third direction on the region of the substrate SUB the two adjacent common source lines CSL. For example, the pillars P may pass through the insulating films IL to contact the substrate SUB. Specifically, a surface layer S of each of the pillars P may include a silicon material having a first type and may operate as a channel region. An inner layer I of each of the pillars P may include an insulating material such as silicon oxide or an air gap.

In the region between the two adjacent common source lines CSL, a charge storage layer CS may be provided along exposed surfaces of the insulating films IL, the pillars P and the substrate SUB. The charge storage layer CS may include a gate insulating layer (or a 'tunneling insulating layer'), a charge trap layer, and a blocking insulating layer. For example, the charge storage layer CS may have an oxide-nitride-oxide (ONO) structure. In addition, a gate electrode GE such as the ground selection lines and string selection lines GSL and SSL and the word lines WL1 to WL8 may be formed on an exposed surface of the charge storage layer CS in the region between two adjacent common source lines CSL.

Each of drains and drain contacts may be formed on each of the pillars P. For example, the drains or drain contacts DR may include a silicon material doped with impurities having a second conductive type. On the drain contacts DR are provided the bit lines BL1 to BL3 extending in a second direction (e.g., X direction) and being spaced apart from each other by a predetermined distance in the first direction.

Figure 4:
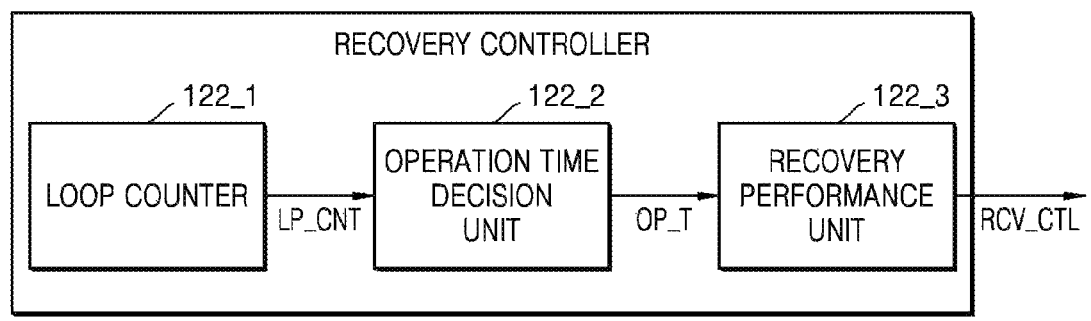
FIG. 4 illustrates a block diagram of a recovery controller of FIG. 1, according to an exemplary embodiment of the inventive concept.

FIG. 4 illustrates a block diagram of a recovery controller of FIG. 1 according to an exemplary embodiment of the inventive concept.

Referring to FIG. 4, the recovery controller 122 may include a loop counter 122_1, an operation time decision unit 122_2, and a recovery performance unit 122_3. The recovery controller 122 may control an operation time of a recovery section in a program (or erase) operation based on a command received from a memory controller.

The loop counter 122_1 may count a number of loops of a memory operation including a plurality of loops and output a loop count LP_CNT therefor. The loop counter 122_1 may increase a loop count one by one, for example, after one loop included in a program operation is performed.

The operation time determination unit 122_2 may determine an operation time OP_T of the recovery section in response to the loop count LP_CNT output from the loop counter 122_1 and then output the operation time OP_T. Hereinafter, the operation time OP_T of the recovery section may be referred to as a time period. In an exemplary embodiment, as a received loop count LP_CNT increases, the operation time determination unit 122_2 may increase an operation time OP_T that is longer than an operation time determined based on a loop count before the received loop count LP_CNT and then output the an operation time OP_T to the recovery performance unit 122_3. The operation time OP_T may be, for example, an operation time of a recovery section for a word line.

In an exemplary embodiment, the operation time decision unit 122_2 may set an operation time for a recovery section as a first operation time period when a received loop count LP_CNT is in a first range, set an operation time as a second operation time period when a loop count LP_CNT is in a second range, or set an operation time as a third operation time period when a loop count LP_CNT is in a third range. The operation time OP_T may be, for example, an operation time of a recovery section for a bit line. In an exemplary embodiment, each of the first and third operation time periods may be shorter than the second operation time period.

In an exemplary embodiment, the first to third ranges may be respectively classified based on a ratio of the number of bit lines in a first state to the number of bit lines in a second state. For example, a bit line in the first state may be a bit line to which a drive voltage has been applied, and a bit line in the second state may be a bit line to which an inhibit voltage has been applied. The loop count LP_CNT may be classified into a first range, for example, when the number of bit lines in the first state in a loop corresponding to the loop count LP_CNT is equal to or less than a first threshold value. The loop count LP_CNT may be classified into a second range, for example, when the number of bit lines in the first state in a loop corresponding to the corresponding loop count LP_CNT is greater than the first threshold value and equal to or less than the second threshold value greater than the first threshold value. The loop count LP_CNT may be classified into a third range, for example, when the number of bit lines in the first state in a loop corresponding to the corresponding loop count LP_CNT is equal to or less than a third threshold value greater than the second threshold value. The recovery performance unit 122_3 may perform a recovery control operation on each line connected to a memory cell array based on an operation time OP_T output from the operation time decision unit 122_2. Further referring to FIG. 1, the recovery performance unit 122_3 may provide a recovery operation control signal RCV_CTL to the row decoder 130, the page buffer 140 and/or the common source line driver 150 to control a recovery operation for each line.

The recovery performance unit 122_3 may provide a recovery operation control signal RCV_CTL, for example, to the row decoder 130 to control a recovery operation for the word lines WL, the string selection lines SSL or the ground selection lines GSL. The recovery performance unit 122_3 may provide a recovery operation control signal RCV_CTL, for example, to the page buffer 140 to control a recovery operation for the bit lines BL. The recovery performance unit 122_3 may provide a recovery operation control signal RCV_CTL, for example, to the common source line driver 150 to control a recovery operation for the common source lines CSL.

Figure 5:
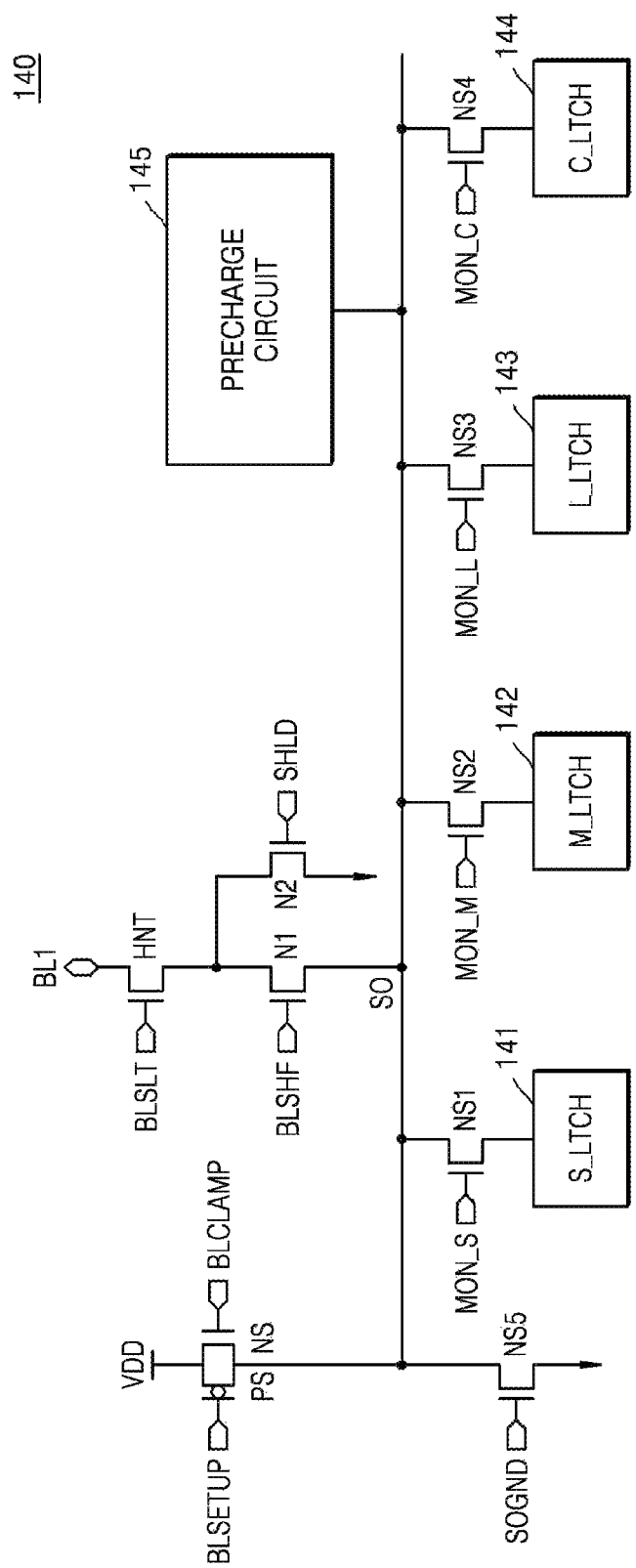
FIG. 5 illustrates a diagram showing a structure of a page buffer of FIG. 1, according to an exemplary embodiment.

FIG. 5 illustrates a diagram showing a structure of a page buffer of FIG. 1 according to an exemplary embodiment.

Referring to FIG. 5, the page buffer 140 may be connected to the cell strings included in the first block (BLK1 of FIG. 3) via the bit line BL1. The page buffer 140 may include a sensing node S0 connected to the bit line BL1. The page buffer 140 may include a sensing latch 141, data latches 142 and 143, a cache latch 144 and a precharge circuit 145 that are respectively connected to the sensing node S0.

In a program operation, a gate voltage BLSLT of a first selection transistor HNT may be a turn-on voltage. For example, the gate voltage BLSLT of the first selection transistor HNT may be provided at the level of the power supply voltage VDD or the sum of the power supply voltage VDD and the threshold voltage Vth (VDD+Vth). The first select transistor HNT may maintain a turned-on state until the recovery operation for the bit line BL1 is complete.

In a program operation, a recovery operation may be performed via a discharge transistor N2 between the bit line BL1 and a ground node. In an exemplary embodiment, in a program operation, a recovery operation according to a loop may be performed by controlling a gate voltage SHLD of the discharge transistor N2. For example, in a recovery section, the bit line BL1 may be discharged by controlling and adjusting a slope of the gate voltage SHLD of the discharge transistor N2.

In another exemplary embodiment, in a program operation, a recovery operation may be performed via a ground connection transistor NS5 between the sensing node S0 and the ground node. For example, in a program operation, a recovery operation according to a loop may be performed by controlling a gate voltage SOGND of the ground connection transistor NS5. In an exemplary embodiment, a size (e.g., width/length) of the ground connection transistor NS5 may be larger than a size of the discharge transistor N2.

Figure 6:
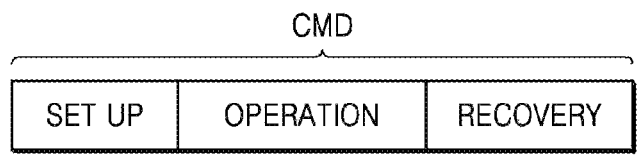
FIG. 6 illustrates a drawing showing an example of sections included in a memory operation.

FIG. 6 illustrates a drawing showing an example of sections included in a memory operation.

Referring to FIG. 6, a memory operation according to a command CMD may include a setup section SET UP, an operation section OPERATION and the recovery section RECOVERY. When the command CMD is a program command, the operation section OPERATION may be a program section. When the command CMD is an erase command, the operation section OPERATION may be an erase section.

The setup section SET UP may mean a section, for example, in which one or more lines connected to a memory cell array are charged to a target voltage. The operation section OPERATION may mean a section, for example, in which the target voltage, which was charged in the setup section SET UP, is maintained. The recovery section RECOVERY may mean a section, for example, in which the target voltage, which was maintained in the operation section OPERATION, is discharged.

Figure 7:
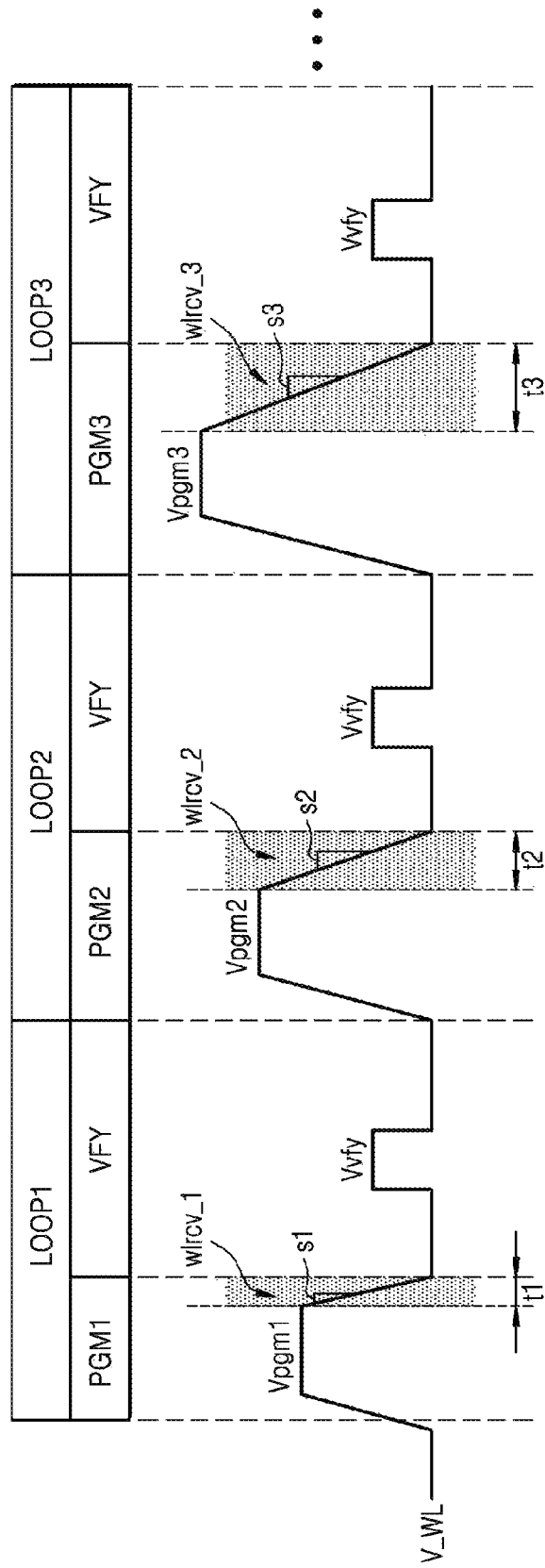
FIG. 7 illustrates a timing diagram of a program operation performed on a word line, according to an exemplary embodiment of the inventive concept.

FIG. 7 illustrates a timing diagram of a program operation performed on a word line according to an exemplary embodiment of the inventive concept. Although a program operation is described in FIG. 7, the inventive concept may also be applied to an erase operation in the same manner. Three loops are illustrated in FIG. 7 for the convenience's sake, but the number of loops is not limited thereto.

Referring to FIG. 7, a program operation may be performed by sequentially performing plurality of loops Loop1 to Loop3. Each of the loops Loop1 to Loop3 may be divided into first to third program sections PGM1 to PGM3, respectively, and a program verification section VFY. For example, the plurality of loops Loop1 to Loop3 may be first to third program loops. The first program loop may include the first program section PGM1 and the program verification section VFY, the second program loop may include the second program section PGM2 and the program verification section VFY, and the third program loop may include the third program section PGM3 and the program verification section VFY.

In the first to third program sections PGM1 to PGM3, program pulses Vpgm1 to Vpgm3 corresponding to the respective loops may be applied to at least one selected word line. A high voltage level of the program pulses Vpgm1 to Vpgm3 may be increased, for example, as a loop process progresses.

The first to third program sections PGM1 to PGM3 may include first to third recovery sections wlrcv_1 to wlrcv_3. In each of the first to third recovery sections wlrcv_1 to wlrcv_3, an operation for discharging a voltage applied to a word line may be performed. Specifically, the first program section PGM1 may include the first recovery section wlrcv_1 having a first operation time period t1, the second program section PGM2 may include the second recovery section wlrcv_2 having a second operation time period t2, and the third program section PGM3 may include the third recovery section wlrcv_3 having a third operation time period t3.

In an exemplary embodiment, the first to third operation time periods t1 to t3 may be different from each other. For example, the second operation time period t2 may be longer than the first operation time period t1, and the third operation time period t3 may be longer than the second operation time period t2. In an exemplary embodiment, first to third slopes s1 to s3 with respect to voltages of word lines respectively discharged in the first to third recovery sections wlrcv_1 to wlrcv_3 may be different from each other. For example, the second slope s2 may be less than the first slope s1 and the third slope s3 may be less than the second slope s2.

In example embodiments, the recovery controller 122 may select one of the first to third slopes s1 to s3 based on an associated count value of a loop among the plurality of loops (e.g., the count value may be read from the loop counter 122_1 of FIG. 4).

In example embodiments, each of the program pulses Vpgm1 to Vpgm3 may be discharged during the first to third recovery sections wlrcv_1 to wlrcv_3 by the discharge circuit 132 of the row decoder 130 in FIG. 1. Each of the program pulses Vpgm1 to Vpgm3 may be discharged with a different slope by adjusting a driving strength of a driver of the discharge circuit 132 based on a count value of a loop where a program operation is performed. As an example, the driving strength of a driver for the first program pulse Vpgm1 may be greater than the driving strength of a driver for the second program pulse Vpgm2, the driving strength of a driver for the second program pulse Vpgm2 may be greater than the driving strength of a driver for the third program pulse Vpgm3. For example, the driving strength may be decided by an ability of current flowing of a transistor. In detail, a driving strength of a transistor having width/length 100 um/0.1 um is greater than a driving strength of a transistor having width/length 50 um/0.1 um.

In a program verification section VFY of each of the loops Loop1 to Loop3, a read operation may be performed to verify whether a program operation in each of the first to third program section PGM1 to PGM3 is succeeded. In the program verification section VFY, a verify voltage Vvfy may be applied to a selected word line. In another embodiment, in the program verification section VFY, different verify voltages may be applied in a plurality of steps.

In example embodiments, the first loop Loop1 may include a first set of loops Loop11 to Loop1x, the second loop Loop2 may include a second set of loops Loop21 to Loop2y, and the third loop Loop3 may include a third set of loops Loop31 to Loop3z. Here, each of x, y and z may be a natural number greater than 2.

In example embodiments, in the first to third program sections PGM1 to PGM3, first to third common source voltages Vcom 1 to Vcom3 (not shown) corresponding to the respective loops may be applied to at least one selected cell string. A voltage level of the first to third common source voltages Vcom1 to Vcom3 may be increased, for example, as a loop process progresses. For example, the first common source voltage Vcom1 may be 0V, the second common source voltage Vcom2 may be 0.2V, and the third common source voltage Vcom3 may be 0.4V. However, exemplary embodiments are not limited thereto. In example embodiments, a voltage level of each of the common source voltages may be variable.

In example embodiments, the first to third program sections PGM1 to PGM3 may include fourth to sixth recovery sections wlrcv_4 to wlrcv_6 (not shown). In each of the fourth to sixth recovery sections wlrcv_4 to wlrcv_6, an operation for discharging a voltage applied to a common source line may be performed. Specifically, the first program section PGM1 may include the fourth recovery section wlrcv_4 having a fourth operation time period t4, the second program section PGM2 may include the fifth recovery section wlrcv_5 having a fifth operation time period t5, and the third program section PGM3 may include the sixth recovery section wlrcv_6 having a sixth operation time period t6.

In example embodiments, the fourth to sixth operation time periods t4 to t6 may be different from each other. For example, the fifth operation time period t5 may be longer than the fourth operation time period t4, and the sixth operation time period t6 may be longer than the fifth operation time period t5. In example embodiments, fourth to sixth slopes s4 to s6 (not shown) with respect to voltages of the common source line respectively discharged in the fourth to sixth recovery sections wlrcv_4 to wlrcv_6 may be different from each other. For example, the fifth slope s5 may be less than the fourth slope s4 and the sixth slope s6 may be less than the fifth slope s5.

In example embodiments, each of the first to third common source voltages Vcom1 to Vcom3 may be discharged during the fourth to sixth recovery sections wlrcv_4 to wlrcv_6 by the common source line driver 150 in FIG. 1. Each of the first to third common source voltages Vcom1 to Vcom3 may be discharged with a different slope by adjusting the driving strength of a driver of the common source line driver 150 based on a count value of a loop where an erase operation is performed. As an example, the driving strength of a driver for the first common source voltage Vcom1 may be greater than the driving strength of a driver for the second common source voltage Vcom2, and the driving strength of a driver for the second common source voltage Vcom2 may be greater than the driving strength of a driver for the third common source voltage Vcom3.

In example embodiments, in the first to third program sections PGM1 to PGM3, first to third string selection line voltages VSSL1 to VSSL3 (not shown) corresponding to the respective loops may be applied to at least one selected cell string. As an example, a voltage level of each of the first to third string selection line voltage VSSL1 to VSSL3 may be maintained at a predetermined voltage. As another example, the voltage level of each of the first to third string selection line voltage VSSL1 to VSSL3 may be increased, for example, as a loop process progresses.

In example embodiments, the first to third program sections PGM1 to PGM3 may include seventh to ninth recovery sections wlrcv_7 to wlrcv_9 (not shown). In each of the seventh to ninth recovery sections wlrcv_7 to wlrcv_9, an operation for discharging a voltage applied to a string selection line SSL may be performed. Specifically, the first program section PGM1 may include the seventh recovery section wlrcv_7 having a seventh operation time period t7, the second program section PGM2 may include the eighth recovery section wlrcv_8 having an eighth operation time period t8, and the third program section PGM3 may include the ninth recovery section wlrcv_9 having a ninth operation time period t9.

In example embodiments, the seventh to ninth operation time periods t7 to t9 may be different from each other. For example, the eighth operation time period t8 may be longer than the seventh operation time period t7, and the ninth operation time period t9 may be longer than the eighth operation time period t8. In example embodiments, seventh to ninth slopes s7 to s9 (not shown) with respect to voltages of the string selection line respectively discharged in the seventh to ninth recovery sections wlrcv_7 to wlrcv_9 may be different from each other. For example, the eighth slope s8 may be less than the seventh slope s7 and the ninth slope s9 may be less than the eighth slope s8.

In example embodiments, each of the first to third string selection line voltages VSSL1 to VSSL3 may be discharged during the seventh to ninth recovery sections wlrcv_7 to wlrcv_9 by the by the discharge circuit 132 of the row decoder 130 in FIG. 1. Each of the first to third string selection line voltages VSSL1 to VSSL3 may be discharged with a different slope by adjusting the driving strength of a driver of the discharge circuit 132 based on a count value of a loop where a program operation is performed. As an example, the driving strength of a driver for the first string selection voltage VSSL1 may be greater than the driving strength of a driver for the second string selection voltage VSSL2, and the driving strength of a driver for the second string selection voltage VSSL2 may be greater than the driving strength of a driver for the third string selection voltage VSSL3.

In example embodiments, in the first to third program sections PGM1 to PGM3, first to third ground selection line voltages VGSL1 to VGSL3 (not shown) corresponding to the respective loops may be applied to at least one selected cell string. An operation for the first to third ground selection line voltages VGSL1 to VGSL3 is similar to the first to third string selection line voltages VSSL1 to VSSL3 except a voltage level of the first to third ground selection line voltages VGSL1 to VGSL3 and thus, detailed description thereof will be omitted.

Figure 8A:
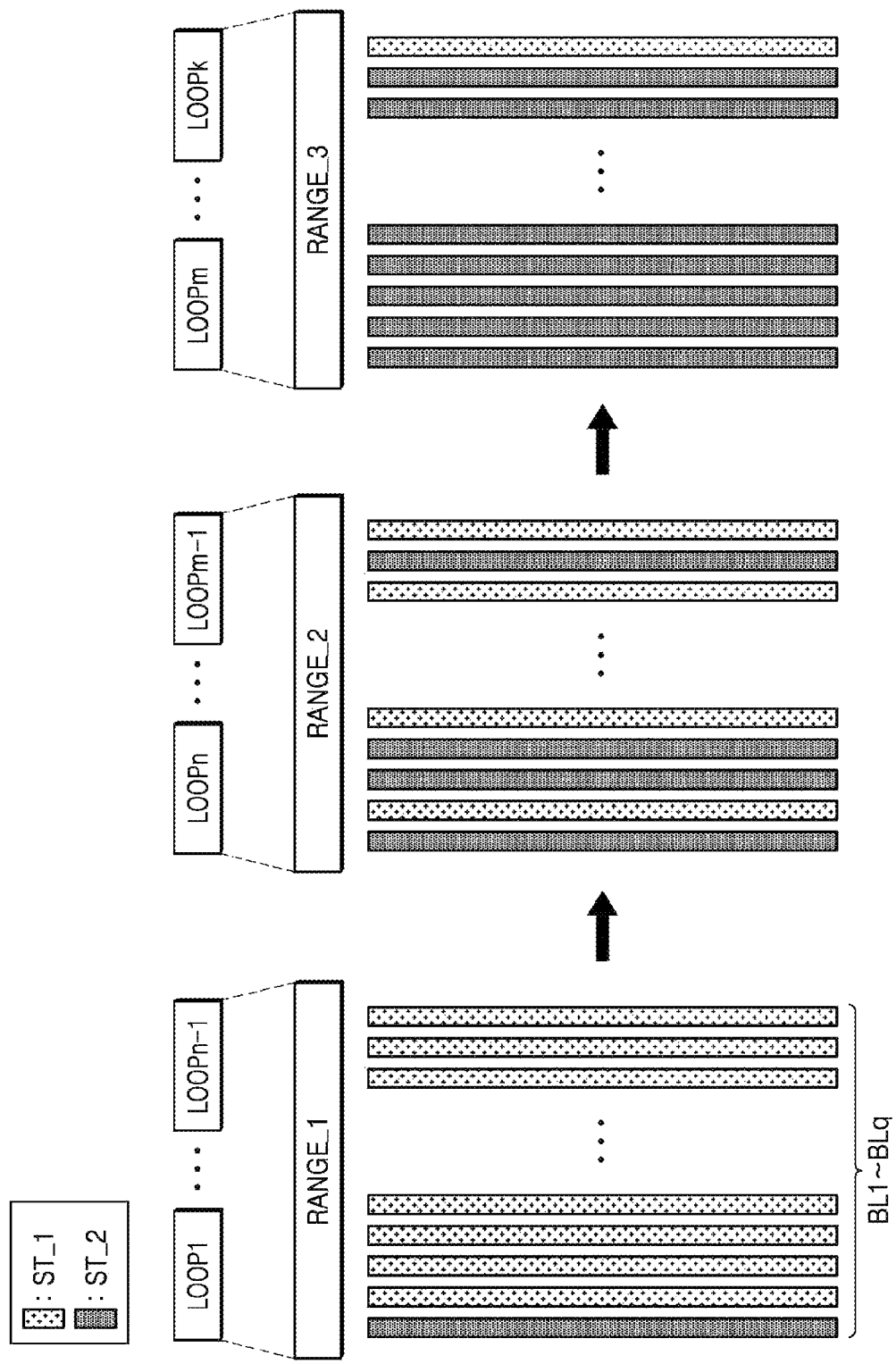
FIG. 8A illustrates loops divided into ranges and bit line states in each range.
Figure 8B:
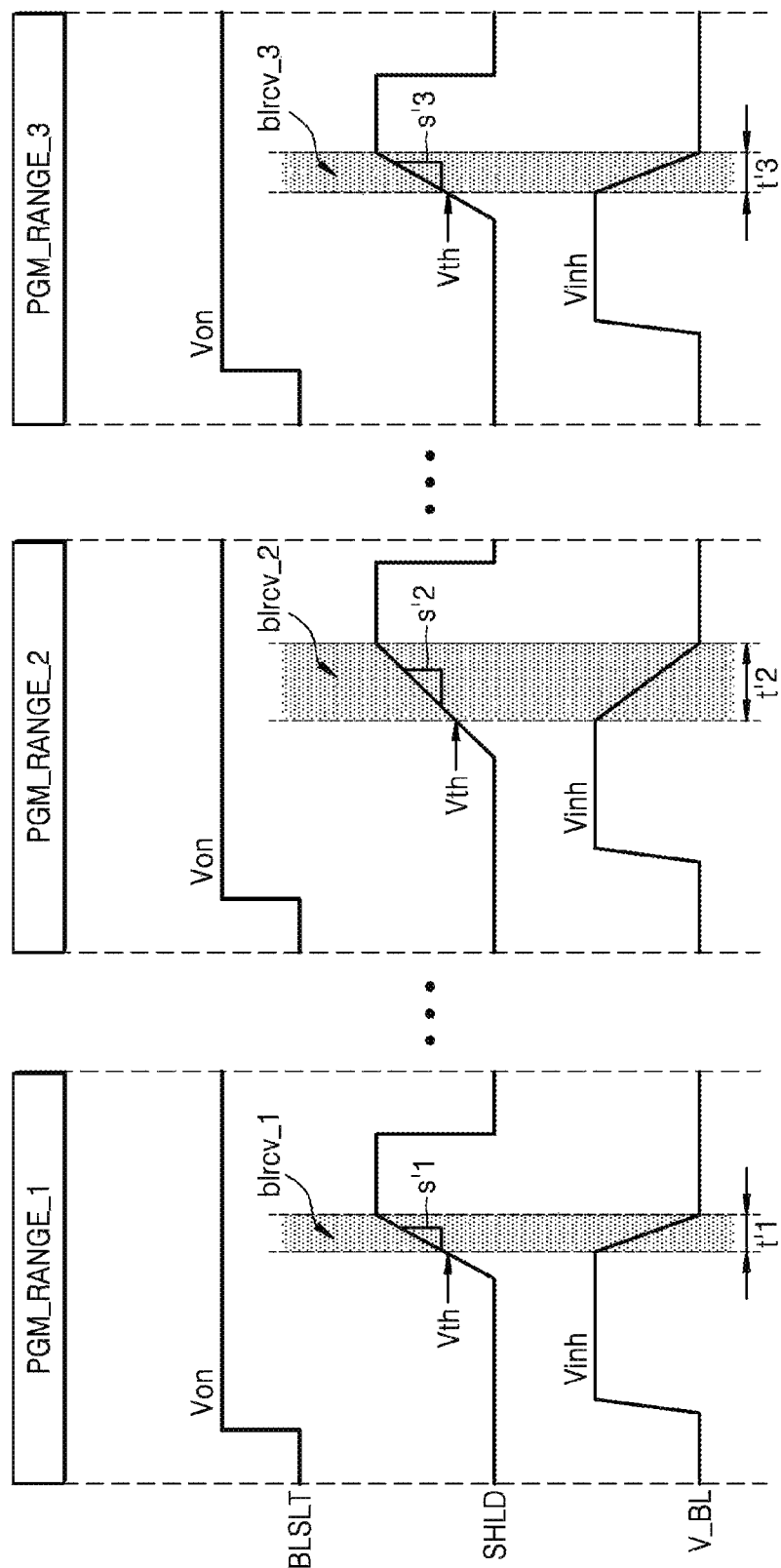
FIG. 8B shows a timing diagram for a program operation performed on a bit line in each range according to an exemplary embodiment of the inventive concept.
Figure 8C:
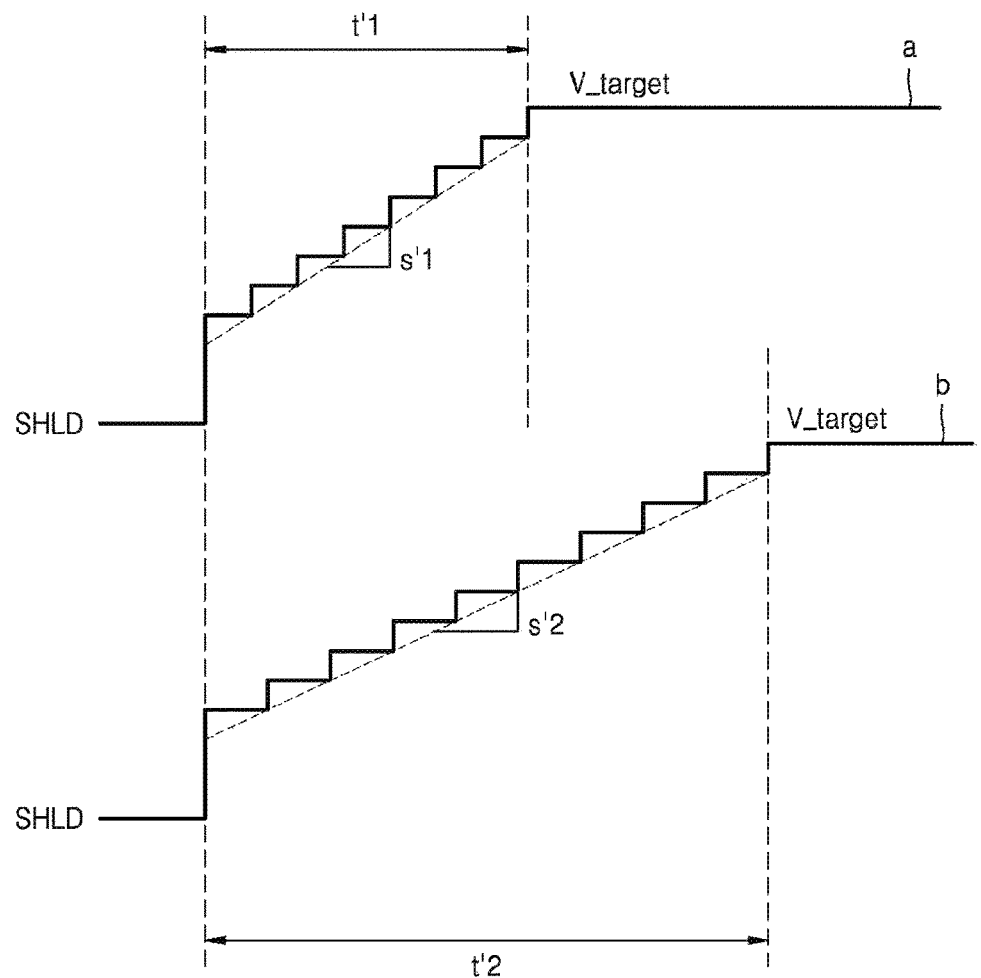
FIG. 8C illustrates a graph of a SHLD voltage in each recovery section.

FIGS. 8A to 8C illustrate drawings showing how to control a recovery operation for a bit line. FIG. 8A shows loops divided into ranges and bit line states in each range, FIG. 8B shows a timing diagram for a program operation performed on a bit line in each range according to an exemplary embodiment of the inventive concept, and FIG. 8C shows a graph of a SHLD voltage in each recovery section.

Referring to FIG. 8A, for example, first to kth loops LOOP1 to LOOPk for performing a memory operation such as a program or erase operation may be divided into first to third ranges RANGE_1 to RANGE_3. Specifically, the first loop LOOP1 to an n-1th loop LOOPn-1 may be included in the first range RANGE_1. An nth loop LOOPn to an m-1th loop LOOPm-1 may be included in the second range RANGE_2. An mth loop LOOPm to the kth loop LOOPk may be included in the third range RANGE_3.

In an exemplary embodiment, the first to third ranges RANGE_1 to RANGE_3 may be decided based on voltage states of bit lines BL1 to BLq. Specifically, the first to third ranges RANGE_1 to RANGE_3 may be decided based on a ratio of the number of bit lines in a first state ST_1 to the number of bit lines in a second state ST_2 among the bit lines BL1 to BLq. For example, a bit line in the first state ST_1 may be a bit line to which a drive voltage has been applied and a bit line in the second state ST_2 may be a bit line to which an inhibit voltage has been applied. As an example, the drive voltage may be a ground voltage (0V) and the inhibit voltage may be a power supply voltage (VCC, VDD or an internal power supply voltage VIN).

As a loop process of a memory operation such as a program (or erase) operation progresses, a program (or erase) operation may not be performed on a verified memory cell. In this regard, as the loop process progresses, the number of bit lines to which an inhibit voltage has been applied may be increase. Thus, in an initial loop, the number of bit lines to which a drive voltage has been applied may be greater than the number of bit lines to which an inhibit voltage has been applied. As the loop process progresses, the numbers may be similar to each other, and then the number of bit lines to which a drive voltage has been applied to may be less than the number of bit lines to which an inhibit voltage has been applied.

For example, as a program operation progresses, a difference between the number of bit lines in the first state ST_1 and the number of bit lines in the second state ST_2, in the second range RANGE_2, may be less than a difference between the number of bit lines in the first state ST_1 and the number of bit lines in the second state ST_2, in the first range RANGE_1. In addition, as a program operation progresses, a difference between the number of bit lines in the first state ST_1 and the number of bit lines in the second state ST_2, in the third range RANGE_3, may be greater than a difference between the number of bit lines in the first state ST_1 and the number of bit lines in the second state ST_2, in the second range RANGE 2.

For example, as a program operation progresses from the first range RANGE_1 to the second range RANGE_2, the number of bit lines in the first state ST_1 and the number of bit lines in the second state ST_2 may become similar and then the program operation progresses from the second range RANGE_2 to the third range RANGE_3, the number of bit lines in the first state ST_1 and the number of bit lines in the second state ST_2 may differ again.

As a difference between the number of bit lines in the first state ST_1 and the number of bit lines in the second state ST_2 gets large, a parasitic capacitance between bit lines may be reduced. Since a parasitic capacitance between the bit lines gradually increases from the first range RANGE_1 to the second range RANGE_2, a recovery section in the second range RANGE_2 for discharging the applied voltage may be longer than a recovery section in the first range RANGE_1. Since a parasitic capacitance between the bit lines gradually decreases from the second range RANGE_2 to the third range RANGE_3, a recovery section in the third range RANGE_3 for discharging the applied voltage may be shorter than a recovery section in the second range RANGE_2. In FIG. 8A, the first to kth loops LOOP1 to LOOPk are described to be included in one of the first to third ranges RANGE_1 to RANGE_3, but the number of ranges is not limited thereto.

Referring to FIG. 8B, FIG. 8A illustrates a program section included in each of loops of the first to third ranges RANGE_1 to RANGE_3. Specifically, each of loops included in the first range RANGE_1 may include a first range program section PGM_RANGE_1, each of loops included in the second range RANGE_2 may include a second range program section PGM_RANGE_2, and each of loops included in the third range RANGE_3 may include a third range program section PGM_RANGE_3.

Further referring FIG. 5, in the first to third range program sections PGM_RANGE_1 to PGM_RANGE_3, a gate voltage BLSLT of the first selection transistor HNT may be a turn-on voltage Von. The turn-on voltage Von of the first selection transistor HNT may be, for example, a power supply voltage VDD or a sum of the power supply voltage VDD and a threshold voltage Vth (VDD+Vth). The gate voltage BLSLT of the first selection transistor HNT may maintain the provided turn-on voltage Von during the program section.

In each of the first to third range program sections PGM_RANGE_1 to PGM_RANGE_3, an unselected bit line is set to the inhibit voltage Vinh, and after the inhibit voltage Vinh is maintained for the predetermined time period, the inhibit voltage Vinh may be discharged. For example, the predetermined time period for which the inhibit voltage Vinh is maintained in the unselected bit line may be a time period for which a program pulse (e.g., Vgpm1 of FIG. 7) is applied to a selected word line.

Specifically, a recovery operation during a first recovery section blrcv_1 having a first operation time period t'1 may be performed on an unselected bit line in the first range program section PGM_RANGE_1. A recovery operation during a second recovery section blrcv_2 having a second operation time period t'2 may be performed on an unselected bit line in the second range program section PGM_RANGE_2. A recovery operation during a third recovery section blrcv_3 having a third operation time period t'3 may be performed on an unselected bit line in the third range program section PGM_RANGE_3.

In an exemplary embodiment, an operation time for a recovery section of an unselected bit line may be determined by controlling (or, adjusting) strength of a discharge transistor N2 (e.g., a switch). For example, the strength of the discharge transistor N2 may be adjusted by a gate voltage SHLD applied to the discharge transistor N2. For example, when the discharge transistor N2 is turned on to perform a recovery operation, the first to third recovery sections blrcv_1 to blrcv_3 may start. The discharge transistor N2 may be substantially turned on when the gate voltage SHLD becomes a level equal to or higher than the threshold voltage Vth of the discharge transistor N2.

After the discharge transistor N2 is turned on, a level of a gate voltage SHLD may increase with a constant slope in the first to third recovery sections blrcv_1 to blrcv_3. Specifically, a gate voltage SHLD in the first recovery section blrcv_1 may increase a voltage level with a first slope s'1, a gate voltage SHLD in the second recovery section blrcv_2 may increase a voltage level with a second slope s'2, and a gate voltage SHLD in the third recovery section blrcv_3 may increase a voltage level with a third slope s'3.

The first to third slopes s'1 to s'3 may respectively be a basis for controlling a first to third operation time periods t'1 to t'3 of the first to third recovery sections blrcv_1 to blrcv_3. In an exemplary embodiment, the second slope s'2 may be less than the first slope s'1. Also, the second slope s'2 may be less than the third slope s'3. The first slope s'1 may be, for example, the same as the third slope s'3, but embodiments are not limited thereto.

In example embodiments, an unselected bit line may be discharged in the second recovery section blrcv_2 via the discharge transistor N2 for a time period that is longer than a time period in the first recovery section blrcv_1 and/or the third recovery section blrcv_3. For example, the second operation time period t'2 may be greater than the first operation time period t'1. Also, the second operation time period t'2 may be greater than the third operation time period t'3.

Referring to FIG. 8C, described is a specific waveform diagram of a gate voltage SHLD provided to a gate of the discharge transistor N2. An 'a' waveform diagram may describe, for example, a waveform of the gate voltage SHLD in the first recovery section blrcv_1 or the third recovery section blrcv_3 of FIG. 8B, and a 'b' waveform diagram may describe, for example, a waveform of the gate voltage SHLD in the second recovery section blrcv_2 of FIG. 8B.

First, referring to the 'a' waveform diagram, the gate voltage SHLD may increase with a first slope s'1. The gate voltage SHLD may increase over a first operation time period t'1 to reach a target voltage V_target. Referring to the 'b' waveform diagram, the gate voltage SHLD may increase with a second slope s'2. The gate voltage SHLD may increase over a second operation time period t'2 to reach a target voltage V_target.

In an exemplary embodiment, the second slope s'2 may be less than the first slope s'1. Thus, an amount of charge discharged via the discharge transistor N2 when the gate voltage SHLD has the second slope s'2 may be less than an amount of charge discharged via the discharge transistor N2 when the gate voltage SHLD has the first slope s'1. In this regard, the gate voltage SHLD of the discharge transistor N2 may be controlled to control a time period for a recovery operation of an unselected bit line. Each of the waveform diagrams described in FIG. 8C is an exemplary embodiment of the inventive concept, and a waveform may vary in various forms according to example embodiments.

In example embodiments, an operation time for a recovery section of an unselected bit line may be determined by adjusting strength of the discharge transistor N2. For example, the discharge transistor N2 may include a plurality of transistors having different sizes (e.g., width). Thus, the control logic unit 120 may select a transistor having a particular width among the plurality of transistors of the discharge transistor N2 based on each of loops of the first to third ranges RANGE_1 to RANGE_3.

Figure 9:
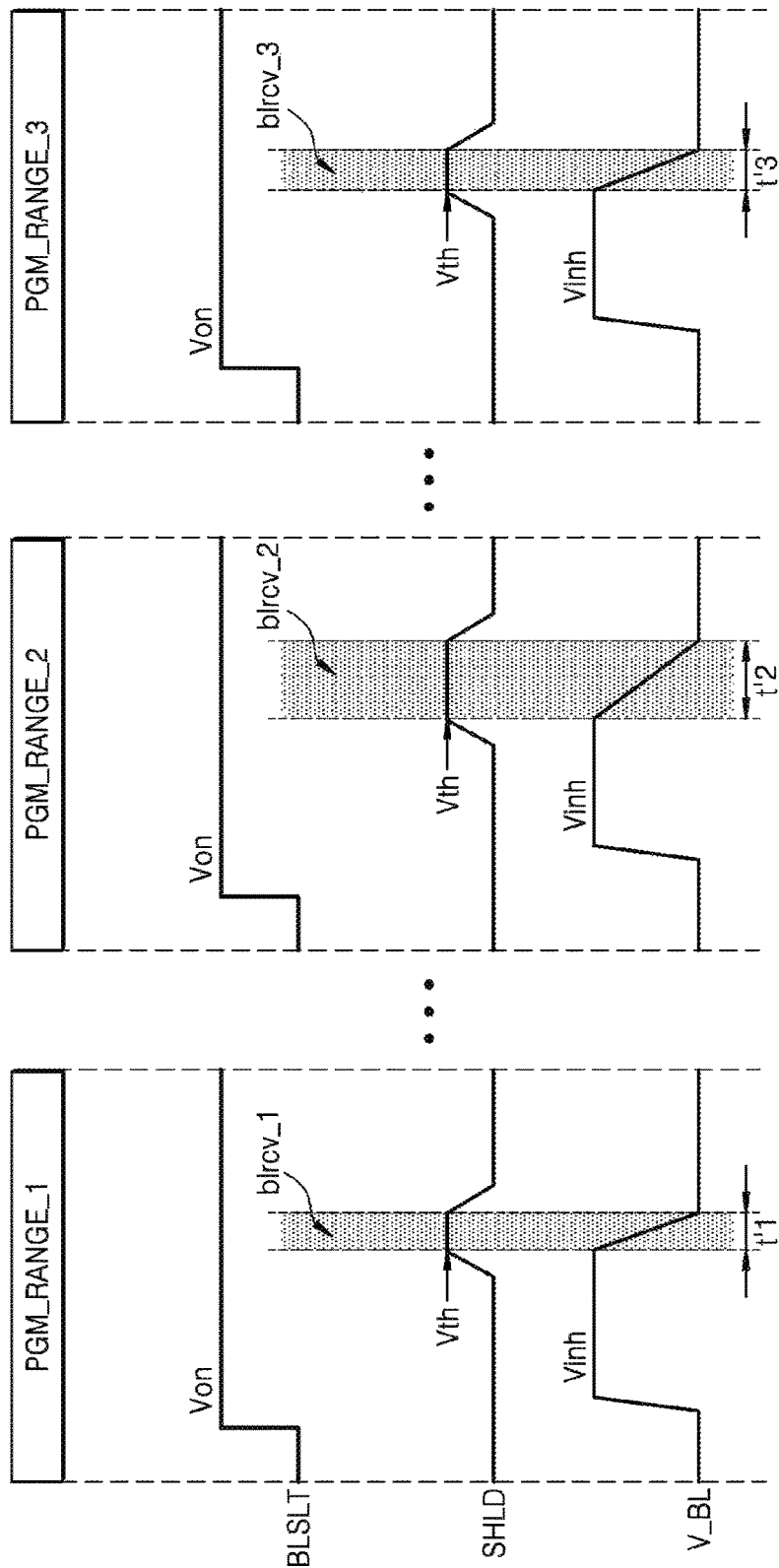
FIG. 9 illustrates a timing diagram of a program operation performed on a bit line in each range, according to another exemplary embodiment of the inventive concept.

FIG. 9 illustrates a timing diagram of a program operation performed on a bit line in each range according to another exemplary embodiment of the inventive concept.

The timing diagram of FIG. 9 is the same as the timing diagram of FIG. 8B, except that in FIG. 9, a gate voltage SHLD of the discharge transistor N2 may be maintained at a voltage level equal to or greater than a threshold voltage rather than increase with a predetermined slope in each of recovery sections blrcv_1 to blrcv_3. In this case, operation time periods t'1 to t'3 of respective recovery sections blrcv_1 to blrcv_3 may be controlled base on a time period for which the gate voltage SHLD is maintained at a voltage level equal to or greater than the threshold voltage.

In an exemplary embodiment, a time period for which a gate voltage SHLD is maintained at a voltage level equal to or greater than a threshold voltage in a second range program section PGM_RANGE_2 may be greater than a time period for which a gate voltage SHLD is maintained at a voltage level equal to or greater than a threshold voltage in a first range program section PGM_RANGE_1. Also, the time period for which the gate voltage SHLD is maintained at the voltage level equal to or greater than the threshold voltage in the second range program section PGM_RANGE_2 may be greater than a time period for which a gate voltage SHLD is maintained at a voltage level equal to or greater than a threshold voltage in a third range program section PGM_RANGE_3.

Figure 10:
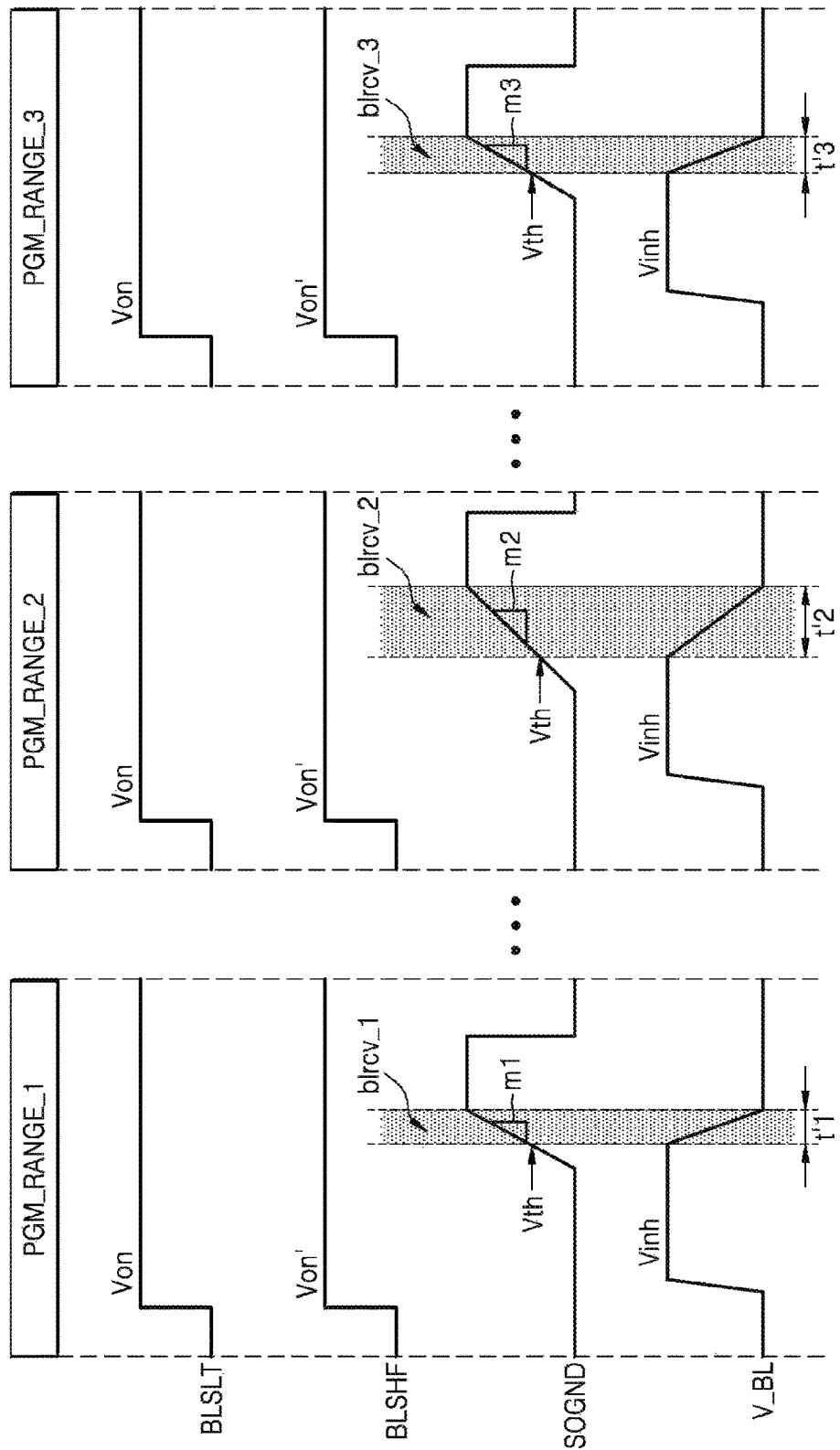
FIG. 10 illustrates a timing diagram of a program operation performed on a bit line in each range, according to another exemplary embodiment of the inventive concept.

FIG. 10 illustrates a timing diagram of a program operation performed on a bit line in each range according to another exemplary embodiment of the inventive concept.

The timing diagram of FIG. 10 is the same as the timing diagram of the FIG. 8B, except that, in FIG. 10, a recovery operation may be performed via the ground connection transistor NS5 between the sensing node S0 and a ground node in each of recovery sections blrcv_1 to blrcv_3. In an exemplary embodiment, a recovery operation in each of recovery sections blrcv_1 to blrcv_3 may be performed by controlling a gate voltage SOGND of the ground connection transistor NS5. A size (e.g., width/length) of the ground connection transistor NS5 may be, for example, larger than a size of the discharge transistor N2.

Specifically, in first to third range program sections PGM_RANGE_1 to PGM_RANGE 3, a gate voltage BLSLT of the first selection transistor HNT may be provided with a turn-on voltage Von. Also, in the first to third range program sections PGM_RANGE_1 to PGM_RANGE_3, a gate voltage BLSHF of a second selection transistor N1 may be provided with a turn-on voltage Von'. The gate voltages BLSLT and BLSHF may be maintained as the respective provided turn-on voltages Von and Von' in a program section. The turn-on voltages Von and Von' of the gate voltages BLSLT and BLSHF may be different from each other, but embodiments are not limited thereto.

In an exemplary embodiment, in each of first to third recovery sections blrcv_1 to blrcv_3, an operation time period may be determined by controlling a gate voltage SOGND of the ground connection transistor NS5. For example, when the ground connection transistor NS5 is turned on to perform a recovery operation, each of the first to the third recovery sections blrcv_1 to blrcv_3 may start. The ground connection transistor NS5 may be substantially turned on when the gate voltage SOGND is equal to or greater than a threshold voltage Vth of the ground connection transistor NS5.

After the ground connection transistor NS5 is turned on, a level of the gate voltage SOGND may increase with a constant slope in the first to third recovery sections blrcv_1 to blrcv_3. Specifically, the gate voltage SOGND may increase a voltage level with a first slope m1 in the first recovery section blrcv_1, the gate voltage SOGND may increase a voltage level with a second slope m2 in the second recovery section blrcv_2, and the gate voltage SOGND may increase a voltage level with a third slope m3 in the third recovery section blrcv_3.

The first to third slopes m1 to m3 may respectively be a basis for controlling operation time periods t'1 to t'3 of the first to third recovery sections blrcv_1 to blrcv_3. In an exemplary embodiment, the second slope m2 may be less than the first slope m1. Also, the second slope m2 may be less than the third slope m3. The first slope m1 may be, for example, the same as the third slope m3, but embodiments are not limited thereto.

Figure 11:
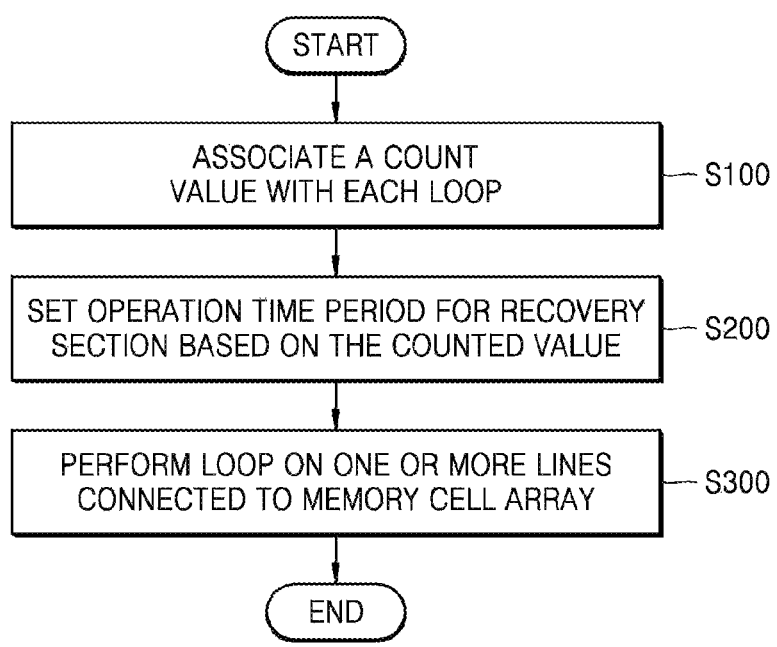
FIG. 11 illustrates a flowchart showing a method of operating a memory device, according to an exemplary embodiment of the inventive concept.

FIG. 11 illustrates a flow chart showing a method of operating a memory device according to an exemplary embodiment of the inventive concept. Referring to FIG. 11, a memory operation for a memory cell array may be performed via a plurality of loops. A memory operation may be, for example, a program or erase operation. Each loop may be, for example, applying a program voltage or erase voltage to an individual row, page or block.

A memory device may associate a count value with each loop of a plurality of loops (S100). In an exemplary embodiment, an association of a loop count may be performed in the loop counter (122_1 of FIG. 4) included in the recovery controller (122 of FIG. 4).

After associating the count value with each loop, an operation time period for the recovery section may be set based on the count value (S200). In an exemplary embodiment, a setting of the operation time period may be performed in the operation time decision unit (122_2 of FIG. 4) included in the recovery controller (122 of FIG. 4). Regarding a recovery section of a word line, the operation time decision unit (122_2 of FIG. 4) may determine, for example, an operation time period to be longer than an operation time period determined based on a previous loop count as a received loop count increases.

After setting the operation time period for the recovery section, a loop may be performed on one or more lines connected to a memory cell array based on the operation time period (S300). The line connected to the memory cell array may include, for example, at least one of a word line, a bit line, a string selection line, a ground selection line and a common source line. In an exemplary embodiment, the recovery performance unit (122_3 of FIG. 4) included in the recovery controller (122 of FIG. 4) may control a recovery section of the loop performed on the line based on the set operation time period.

Figure 12:
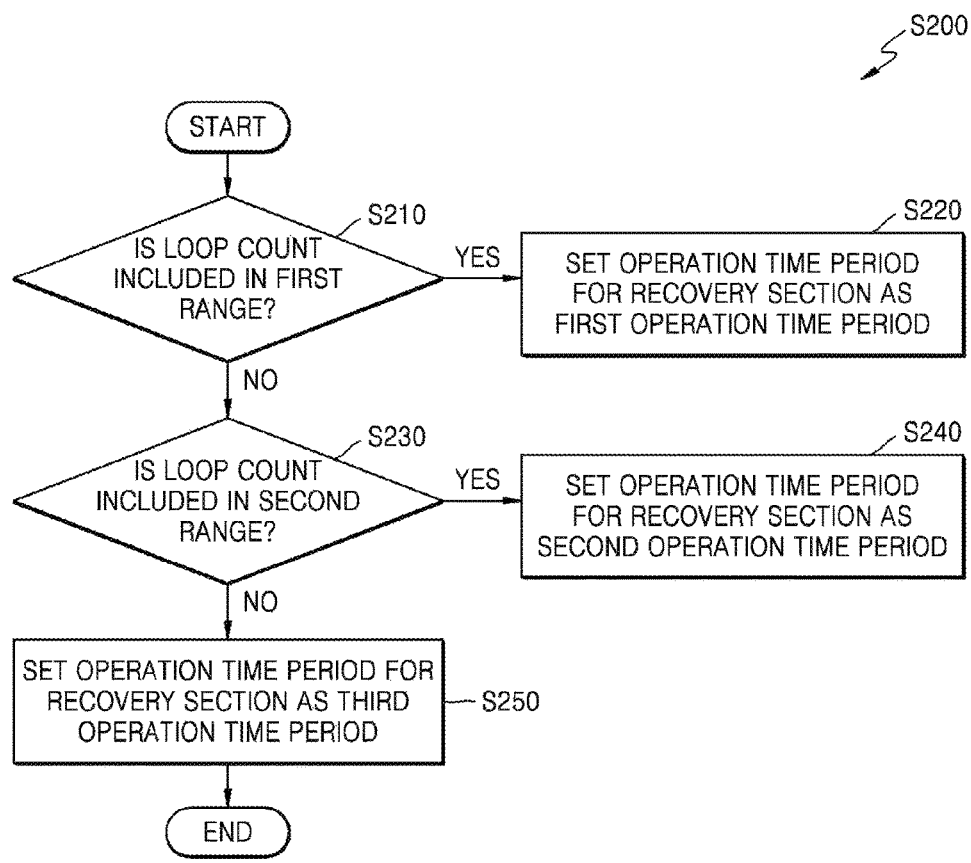
FIG. 12 illustrates a flowchart showing a method of setting an operation time for a recovery section, according to an exemplary embodiment of the inventive concept.

FIG. 12 illustrates a flow chart showing a method of setting an operation time period for a recovery section according to an exemplary embodiment of the inventive concept. The flow chart of FIG. 12 may be an exemplary embodiment of setting the operation time period for the recovery section based on the loop count (S200), described in FIG. 11.

Referring to FIG. 12, it may be determined whether the confirmed loop count is included in a first range (S210). As a result of the determination, when the loop count is included in the first range (e.g., is part of a first set of loops), the operation time period for the recovery section may be set as a first operation time period (S220).

When the loop count is not included in the first range, it may be determined whether the loop count is included in a second range (S230). As a result of the determination, when the loop count is included in the second range (e.g., is part of a second set of loops), the operation time for the recovery section may be set as a second operation time period (S240).

When the loop count is not included in the second range, the operation time period for the recovery section may be set as a third operation time period (S250). In this case, for example, the loop count may be included in a third range (e.g., is part of a third set of loops). In an exemplary embodiment, the first to third ranges may be determined according to a voltage state of bit lines. Specifically, the first to third ranges may be determined based on a ratio of the number of bit lines in a first state to the number of bit lines in a second state. For example, the bit line in the first state may be a bit line to which a drive voltage (e.g., 0V) has been applied, and the bit line in the second state is a bit line to which an inhibit voltage (e.g., VDD) has been applied.

Figure 13:
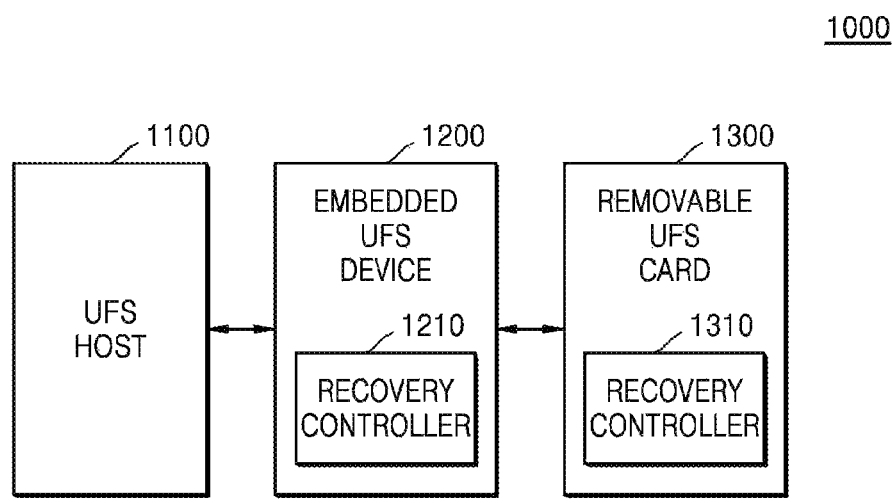
FIG. 13 illustrates a block diagram showing a universal flash storage (UFS) having a memory device, according to an exemplary embodiment of the inventive concept.

FIG. 13 illustrates a block diagram showing a universal flash storage (UFS) having a memory device according to an exemplary embodiment of the inventive concept.

Referring to FIG. 13, a UFS system 1000 may include a UFS host 1100, an embedded UFS device 1200 and a removable UFS card 1300. The UFS host 1100 may be an application processor of a mobile device. Each of the UFS host 1100, the embedded UFS device 1200 and the removable UFS card 1300 may communicate with external devices via a UFS protocol. At least one of the embedded UFS device 1200 and the removable UFS card 1300 may include the recovery controller 122 of FIG. 1 and may perform the method of operation the memory device of FIGS. 1 to 12.

A memory card, a nonvolatile memory device, and a card controller according to an exemplary embodiment of the inventive concept may be mounted by using various types of packages. For example, the nonvolatile r memory device and/or the memory controller according to an exemplary embodiment of the inventive concept may be mounted using various types of packages such as package on package (PoP), ball grid array (BGA), chip scale package (CSP), plastic leaded chip carrier (PLCC), plastic dual in-line package (PDIP), die in waffle pack, die in wafer form chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), and wafer-level fabricated package (WFP).

While the present disclosure has been particularly shown and described with reference to embodiments thereof, it will be understood that various changes in form and details may be made therein without departing from the spirit and scope of the following claims.

What is claimed is:

1. A method of operating a nonvolatile memory device including a memory cell array connected to a plurality of lines, the method comprising:
   performing a first loop including a first recovery section having a first operation time period, on a first line of the plurality of lines by applying a first voltage for a time period, wherein the first voltage is discharged with a first slope; and
   performing a second loop after the first loop including a second recovery section having a second operation time period that is different from the first operation time period, on the first line by applying a second voltage for a time period, wherein the second voltage is discharged with a second slope less than the first slope.

2. The method of claim 1, wherein performing the second loop comprises:
   reading a count value of the second loop or a voltage level of the second voltage; and
   determining the second operation time period based on a result of the reading.

3. The method of claim 2, wherein when the first line includes the bit line connected to the memory cell array, the bit line is discharged during the second operation time period by adjustably applying a gate voltage of a switch between the bit line and a ground.

4. The method of claim 3, wherein adjustably applying the gate voltage includes selecting a slope of the gate voltage of the switch.

5. The method of claim 2, wherein when the first line includes the bit line connected to the memory cell array, each of the first operation time period and the second operation time period is determined based on a ratio of the number of bit lines in a first state to the number of bit lines in a second state different from the first state, among bit lines connected to the memory cell array.

6. The method of claim 5, wherein each bit line in the first state is a bit line to which a drive voltage has been applied, wherein each bit line in the second state is a bit line to which an inhibit voltage has been applied.

7. The method of claim 1, wherein when the first line includes a word line connected to the memory cell array, the second operation time period is greater than the first operation time period.

8. The method of claim 1, wherein, in the first recovery section, the first voltage applied to the first line is discharged to a first level in the first recovery section using a first driving strength, and
   wherein in the second recovery section, the second voltage applied to the first line is discharged to the first level in the second recovery section using a second driving strength different from the first driving strength.

9. The method of claim 1, wherein when the first line includes at least one of a common source line, a string selection line and a ground selection line, connected to the memory cell array, a voltage level of the first line is increased when the number of loops is increased.

10. The method of claim 1, wherein operating the nonvolatile memory device includes either a program operation or an erase operation for the nonvolatile memory device.

11. A method of operating a nonvolatile memory device including a memory cell array having a plurality of memory cells connected to a plurality of lines, which the nonvolatile memory device performs a memory operation including a plurality of loops with respect to the memory cell array, the method comprising;
associating a count value of each loop of the plurality of loops;
setting, based on the count value of a first loop, a first operation time period for a first recovery section of the first loop; and
performing the first loop including the first recovery section where the first operation time period is set on a first line of the plurality of lines.

12. The method of claim 11, wherein in the setting of the first operation time period, the first operation time period for the first recovery section is set to be shorter than a second operation time period for a second recovery section of a second loop that occurs after the first loop.

13. The method of claim 12, wherein, the first loop is one of a first plurality of loops each having the first operation time period for a respective recovery section,
wherein the second loop is one of a second plurality of loops each having the second operation time period for a respective recovery section, and further comprising:
a third plurality of loops including a third loop having a third operation time period for its recovery section,
wherein the second plurality of loops occur after the first plurality of loops and before the third plurality of loops, and
wherein the first operation time period is a different amount of time from the second operation time period.

14. The method of claim 13, wherein each of the first and third operation time periods is shorter than the second operation time period.

15. The method of claim 14, wherein the first operation time period is shorter than the second operation time period and the second operation time period is shorter than the third operation time period.

16. A method of operating a nonvolatile memory device including a memory cell array connected to a plurality of lines, the method comprising:
performing a plurality of loops; and
for each loop, applying a voltage to a first line of the plurality of lines for a time period and discharging the voltage applied to the first line to a first level during a recovery time period,
wherein the recovery time period is adjusted based on a count value of a loop of the plurality of loops, and
wherein each loop of the plurality of loops is either a program loop in a program operation of the nonvolatile memory device or an erase loop in an erase operation of the nonvolatile memory device.

17. The method of claim 16, wherein a voltage level of the applied voltage to the first line is adjusted based on the count value of a loop of the plurality of loops.

18. The method of claim 16, comprising:
applying a first voltage to the first line and discharging the first voltage to the first level in a first loop; and
applying a second voltage greater than the first voltage to the first line and discharging the second voltage to the first level in a second loop which is performed after the first loop is completed,
wherein a first recovery time period in the first loop is shorter than a second recovery time period in the second loop.

19. The method of claim 18, further comprising:
during the first and second recovery time periods, respectively discharging the first and second voltages to the first level by a circuit of the nonvolatile memory device, including discharging the first voltage to the first level using a first driving strength of the circuit and discharging the second voltage to the first level using a second driving strength less than the first driving strength of the circuit.

20. The method of claim 16, wherein when the first line includes a word line connected to the memory cell array, a first recovery time period of each loop of a first set of loops of the plurality of loops is shorter than a second recovery time period of each loop of a second set of loops of the plurality of loops and the second recovery time period of each loop of the second set of loops is shorter than a third recovery time period of each loop of a third set of loops of the plurality of loops,
wherein when the first line includes a bit line connected to the memory cell array, each of a first recovery time period of each loop of a first set of loops of the plurality of loops and a third recovery time period of each loop of a third set of loops of the plurality of loops is shorter than a second recovery time period of each loop of a second set of loops of the plurality of loops, and
wherein the second set of loops is performed after the first set of loops is completed, and the third set of loops is performed after the second set of loops is completed.

* * * * *